US010643699B2

(12) United States Patent
Kim et al.

(10) Patent No.: US 10,643,699 B2
(45) Date of Patent: May 5, 2020

(54) FEEDBACK FIELD-EFFECT ARRAY DEVICE CAPABLE OF CONVERTING BETWEEN VOLATILE AND NON-VOLATILE OPERATIONS AND ARRAY CIRCUIT USING THE SAME

(71) Applicant: Korea University Research and Business Foundation, Seoul (KR)

(72) Inventors: Sang Sig Kim, Seoul (KR); Kyoung Ah Cho, Seoul (KR); Hyun Gu Kang, Seoul (KR); Jin Sun Cho, Seoul (KR); Doo Hyeok Lim, Seoul (KR); Yoon Joong Kim, Seoul (KR); Sol A Woo, Gwacheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/181,758

(22) Filed: Nov. 6, 2018

(65) Prior Publication Data
US 2020/0075098 A1    Mar. 5, 2020

(30) Foreign Application Priority Data

Sep. 5, 2018    (KR) .................... 10-2018-0106118

(51) Int. Cl.
*G11C 14/00*    (2006.01)
*G11C 11/40*    (2006.01)
(Continued)

(52) U.S. Cl.
CPC ...... *G11C 14/0018* (2013.01); *G11C 11/4023* (2013.01); *G11C 16/0466* (2013.01); *H01L 27/10802* (2013.01); *H01L 27/11578* (2013.01)

(58) Field of Classification Search
CPC ............ G11C 14/0018; G11C 11/4023; G11C 16/0466; H01L 27/10802; H01L 27/11578
See application file for complete search history.

(56) References Cited

U.S. PATENT DOCUMENTS 7,660,144 B2 *    2/2010    Bhattacharyya ........ G11C 11/40
                                                               365/105
8,098,518 B2 *    1/2012    Kim ......................... G11C 8/10
                                                               365/148
(Continued)

FOREIGN PATENT DOCUMENTS

JP    2015-158964 A    9/2015
KR    10-1169396 B1    7/2012
(Continued)

OTHER PUBLICATIONS

Korean Office Action dated Nov. 28, 2019 in corresponding Korean Patent Application No. 10-2018-0106118 (5 pages in Korean).

*Primary Examiner* — Tri M Hoang
(74) *Attorney, Agent, or Firm* — NSIP Law

(57) ABSTRACT

The present disclosure discloses a feedback field-effect array device capable of converting between volatile and non-volatile operations and an array circuit using the same. According to one embodiment of the present disclosure, the array circuit may include a plurality of feedback field-effect array devices, wherein the source region of the feedback field-effect electronic device and the drain region of an access electronic device may be connected to each other in series, the feedback field-effect electronic device may be connected to a bit line and a first word line, the access electronic device may be connected to a source line and a second word line, and any one of first and second gate voltages may be applied to the first word line to store data in a first logic state or data in a second logic state.

17 Claims, 17 Drawing Sheets

(51) Int. Cl.
*G11C 16/04* (2006.01)
*H01L 27/108* (2006.01)
*H01L 27/115* (2017.01)
*G11C 11/402* (2006.01)
*H01L 27/11578* (2017.01)

(56) References Cited

U.S. PATENT DOCUMENTS 8,351,240 B2 * 1/2013 Park .................... G11C 11/5678
 365/113
9,214,469 B2 * 12/2015 Yamauchi ............. G11C 11/405
9,734,910 B1 * 8/2017 Park .................... G11C 16/0408

FOREIGN PATENT DOCUMENTS

| KR | 10-2017-0127645 A | 11/2017 |
| KR | 10-1835231 B1 | 3/2018 |
| KR | 10-1857873 B1 | 6/2018 |

\* cited by examiner

700

FEEDBACK FIELD-EFFECT ARRAY DEVICE CAPABLE OF CONVERTING BETWEEN VOLATILE AND NON-VOLATILE OPERATIONS AND ARRAY CIRCUIT USING THE SAME

CROSS-REFERENCE TO RELATED APPLICATION

This application claims priority to Korean Patent Application No. 10-2018-0106118, filed on Sep. 5, 2018 in the Korean Intellectual Property Office, the disclosure of which is incorporated herein by reference.

This research was supported by the MOTIE (Ministry of Trade, Industry & Energy (10067791) and KSRC (Korea Semiconductor Research Consortium) support program for the development of the future semiconductor device.

BACKGROUND OF THE DISCLOSURE

Field of the Disclosure

The present disclosure relates to a feedback field-effect array device capable of converting between volatile and non-volatile operations and an array circuit using the same. More specifically, the present disclosure relates to an array circuit using a plurality of feedback field-effect array devices, wherein each feedback field-effect array device includes an access electronic device and a feedback field-effect device for performing conversion between volatile and non-volatile memory operations by including a nitride charge storage layer.

Description of the Related Art

Recently, as complementary metal-oxide-semiconductor (CMOS) technology focuses on miniaturization, the gap between processor and memory speed, the so-called "memory wall", has become a major bottleneck in overall system performance, thereby increasing interconnection delay and power consumption.

To solve this problem, three-dimensional integration has been proposed. Conventional studies show that three-dimensional integration provides a broader bandwidth and a shorter wire length to overcome this problem.

In addition, several studies have been conducted to integrate capacitorless DRAM and flash memory in a single cell.

Therefore, using a technology of integrating capacitorless DRAM and flash memory in a single cell, yield may be increased while reducing production costs in the three-dimensional integration method.

However, a major problem encountered when integrating capacitorless DRAM and flash memory in a single cell is disturbance of stored data during performance of a volatile memory operation.

In addition, a conventional volatile DRAM memory device and a non-volatile flash memory device have different structures, and the structure of each device is only suitable for the characteristics thereof, so that these memory devices may not be flexibly used when volatile or non-volatile operation characteristics are selectively required.

Accordingly, a novel memory device having a simple structure for miniaturization and integration, having features of lower power and high efficiency for reducing leakage current, and capable of ensuring a sufficient read sensing margin even in a narrow memory window is needed.

Feedback field-effect transistors (FBFETs) are a representative example of a case wherein a non-volatile memory and a volatile memory are integrated in a single cell.

FBFETs may exhibit near-zero subthreshold swing (SS) and excellent volatile memory characteristics due to the positive feedback mechanism thereof. In addition, FBFETs may have a wide sensing margin due to the negligible subthreshold swing thereof.

Since FBFETs may exhibit the characteristics thereof without impact ionization, the FBFET may suppress the disturbance of charge stored in a charge storage layer.

In previous studies, complex operation methods were adopted in FBFETs due to the structure thereof such as charge trap spacers or dual gates.

Therefore, an FBFET-based device having excellent electrical/physical/structural properties and capable of implementing both volatile/non-volatile operation characteristics needs to be developed.

RELATED ART DOCUMENTS

Patent Documents

[Patent Document 1] Korean Patent Application Publication No. 10-2017-0127645, "DUAL-GATE MEMORY DEVICE INCLUDING VERTICAL SEMICONDUCTOR COLUMN"

[Patent Document 2] Korean Patent No. 10-1857873, "LOGIC SEMICONDUCTOR DEVICE"

[Patent Document 3] Korean Patent No. 10-1835231, "SEMICONDUCTOR DEVICE"

SUMMARY OF THE DISCLOSURE

Therefore, the present disclosure has been made in view of the above problems, and it is one object of the present disclosure to provide an array circuit using a feedback field-effect electronic device capable of implementing both volatile and non-volatile operation characteristics in a single device.

It is another object of the present disclosure to provide an array circuit using a feedback field-effect electronic device that allows miniaturization and integration of a memory device and that has low power consumption and high efficiency by reducing leakage current.

It is another object of the present disclosure to provide an array circuit using a feedback field-effect electronic device capable of detecting current and performing a read operation in a relatively short time.

It is another object of the present disclosure to provide an array circuit using a feedback field-effect electronic device capable of preventing a short channel effect caused by miniaturization, wherein the short channel effect may occur when the feedback field-effect electronic device having a high sensing margin detects current in a relatively short time and performs a rapid write operation.

It is yet another object of the present disclosure to provide an array circuit using a feedback field-effect electronic device that requires a low applied voltage during writing and erasing processes, thereby reducing power consumption.

In accordance with one aspect of the present disclosure, provided is an array circuit including a plurality of feedback field-effect array devices, wherein the source region of the feedback field-effect electronic device and the drain region of an access electronic device are connected to each other in series; the feedback field-effect electronic device is connected to a bit line and a first word line; the access electronic device is connected to a source line and a second word line; and any one of first and second gate voltages is applied to the first word line to store data in a first logic state or data in a second logic state.

According to one embodiment of the present disclosure, the feedback field-effect electronic device may include a diode structure including first and second conductivity-type regions, an intrinsic region disposed between the first and second conductivity-type regions, and a barrier region disposed between the intrinsic region and the second conductivity-type region; a tunnel oxide layer disposed so as to surround the barrier region and the intrinsic region; a charge storage layer disposed on the tunnel oxide layer and responsible for storing the electric charge of current introduced from the diode structure; a block oxide layer disposed so as to surround the tunnel oxide layer and the charge storage layer; and a gate electrode disposed so as to surround the intrinsic region on the block oxide layer.

According to one embodiment of the present disclosure, when the first gate voltage is applied through the gate electrode, and a ground voltage is applied through the first and second conductivity-type regions, the charge storage layer may trap electrons introduced from the intrinsic region.

According to one embodiment of the present disclosure, when a second gate voltage is applied through the gate electrode, and the ground voltage is applied through the first and second conductivity-type regions, the charge storage layer may discharge the trapped electrons into the intrinsic region.

According to one embodiment of the present disclosure, when the ground voltage is applied through the first conductivity-type region and the gate electrode, and a first drain voltage is applied through the second conductivity-type region, the feedback field-effect array device may output current associated with the trapped electrons or the discharged electrons through the first conductivity-type region.

According to one embodiment of the present disclosure, the first gate voltage may be greater than the ground voltage, and the second gate voltage may be less than the ground voltage.

According to one embodiment of the present disclosure, when the voltage of the bit line is floated, a first gate voltage is applied through the first word line, and the half voltage of the first gate voltage is applied through the second word line, the data in a first logic state may be stored in the charge storage layer.

According to one embodiment of the present disclosure, when a voltage corresponding to the first gate voltage is applied through the bit line, and a ground voltage is applied through the first and second word lines, the charge storage layer may store the data in a second logic state.

According to one embodiment of the present disclosure, the charge storage layer may be formed using silicon nitride, the tunnel oxide layer may be formed using silicon dioxide, and the block oxide layer may be formed using aluminum oxide.

According to one embodiment of the present disclosure, in the diode structure, the first conductivity-type region may be used as a source region, the second conductivity-type region may be used as a drain region, and the intrinsic region and the barrier region may be used as a channel region, wherein the first source region, the drain region, and the channel region may have identical lengths.

According to one embodiment of the present disclosure, in the diode structure, the first conductivity-type region and the barrier region may be doped with an n-type impurity, and the second conductivity-type region may be doped with a p-type impurity.

According to one embodiment of the present disclosure, in the diode structure, the intrinsic region and the barrier region may operate as a channel region through which electric charge moves, and the first and second conductivity-type regions and the channel region may be formed to have identical lengths.

According to one embodiment of the present disclosure, the block oxide layer may be thicker than the charge storage layer, and the tunnel oxide layer may be thinner than the charge storage layer.

According to one embodiment of the present disclosure, when a fourth gate voltage is applied through the gate electrode, and a first drain voltage is applied through the second conductivity-type region, the feedback field-effect electronic device may store the data in a first logic state.

According to one embodiment of the present disclosure, when the fourth gate voltage is applied through the gate electrode, and a second drain voltage is applied through the second conductivity-type region, the feedback field-effect electronic device may store the data in a second logic state.

According to one embodiment of the present disclosure, when a fifth gate voltage is applied through the gate electrode, and a third drain voltage is applied through the second conductivity-type region, the feedback field-effect electronic device may hold any one of the data in a first logic state and the data in a second logic state.

According to one embodiment of the present disclosure, when a sixth gate voltage is applied through the gate electrode, and the first drain voltage is applied through the second conductivity-type region, the feedback field-effect electronic device may output current associated with the held data through the first conductivity-type region.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF THE DISCLOSURE

Figure 1:
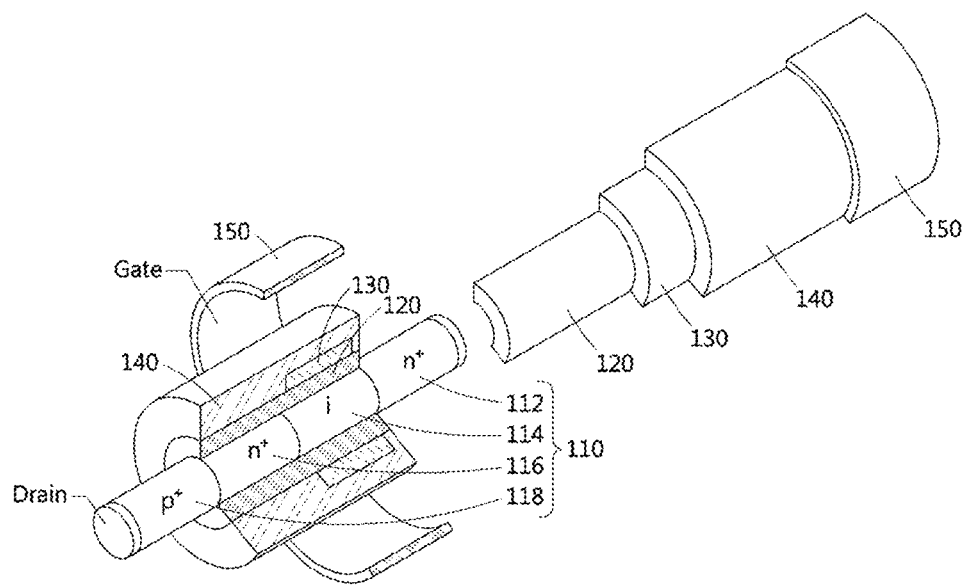
FIG. 1 is a drawing for explaining the stereoscopic configuration of a feedback field-effect electronic device according to one embodiment of the present disclosure.

Hereinafter, various embodiments of the present disclosure will be described with reference to the accompanying drawings.

It should be understood that embodiments and terminology used herein are not intended to limit the present disclosure, but to include various modifications, equivalents, and/or alternatives of the embodiments.

In the following description of the present disclosure, detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements. The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

In this specification, the term "configured to" may be used interchangeably with, for example, "suitable for", "having ability to", "changed to", "made to", "capable of", or "designed to".

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

Terms such as "part" and "unit" used below means a unit for processing at least one function or operation, and may be implemented by hardware or software, or a combination of hardware and software.

FIG. 1 is a drawing for explaining the stereoscopic configuration of a diode structure according to one embodiment of the present disclosure.

Specifically, FIG. 1 illustrates the three-dimensional configuration of a diode structure including a nitride charge storage layer and a gate electrode surrounding the entire channel region.

Referring to FIG. 1, the diode structure may include a tunnel oxide layer 120 surrounding a diode structure 110, a charge storage layer 130, a block oxide layer 140, and a gate electrode 150 in order.

According to one embodiment of the present disclosure, the diode structure 110 may include first and second conductivity-type regions 112 and 118, an intrinsic region 114 disposed between the first and second conductivity-type regions 112 and 118, and a barrier region 116 disposed between the intrinsic region 114 and the second conductivity-type region 118.

The diode structure 110 may be referred to as any one of a p-n-i-n transistor, a memory device, a semiconductor device, and a storage device.

According to one embodiment of the present disclosure, the diode structure 110 may operate as an n-channel semiconductor device, and may exhibit similar characteristics to an n-channel MOSFET device except for hysteresis characteristics.

In addition, in the diode structure 110, the first conductivity-type region 112 may operate as a source region, and the second conductivity-type region 118 may operate as a drain region.

That is, the first conductivity-type region 112 may be referred to as a source region, and the second conductivity-type region 118 may be referred to as a drain region.

According to one embodiment of the present disclosure, the diode structure 110 may be vertically or horizontally formed on a substrate, the substrate may be a single-crystal silicon substrate, and the diode structure 110 may be a silicon substrate in a polycrystalline or single crystal state.

For example, the diode structure 110 may be doped with a first or second conductivity type depending on vertical positions on a substrate.

In this case, the first conductivity type may be n-type, and the second conductivity type may be p-type.

According to one embodiment of the present disclosure, the diode structure may further include a gate insulating film disposed between the intrinsic region 114 and the gate electrode 150 so as to surround the intrinsic region 114. In this case, the gate insulating film may be a silicon oxide film.

For example, the diode structure 110 may exhibit a $p^+$-$n^+$-i-$n^+$ structure, and may include a first p-n junction, a second p-n junction, and a third p-n junction.

In this case, $p^+$ may indicate a case wherein doping is performed with a high concentration of a p-type impurity, and $n^+$ may indicate a case wherein doping is performed with a high concentration of an n-type impurity.

For example, an n-channel may indicate a case wherein both sides of the diode structure 110 with respect to the intrinsic region 114 are doped with an n-type impurity.

In addition, a p-channel may indicate a case wherein both sides of the diode structure 110 with respect to the intrinsic region 114 are doped with a p-type impurity.

For example, the diode structure 110 may have an overall length of 160 nm and a diameter of about 6 nm.

According to one embodiment of the present disclosure, the diode structure 110 may be divided into a drain region, a source region, and a channel region, and the overall length of each region may be the same.

That is, according to one embodiment of the present disclosure, in the diode structure 110, the intrinsic region 114 and the barrier region 116 may operate as a channel region through which electric charge moves, and the first and second conductivity-type regions 112 and 118 and the channel region may be formed to have identical lengths.

According to one embodiment of the present disclosure, the tunnel oxide layer 120 may be formed using silicon dioxide, and may serve as a path for transferring electric charge between the charge storage layer 130 and the diode structure.

According to one embodiment of the present disclosure, the charge storage layer 130 may be disposed on the tunnel oxide layer, and may store the electric charge of current introduced from the diode structure.

For example, the charge storage layer 130 may be formed using silicon nitride.

According to one embodiment of the present disclosure, the charge storage layer 130 may trap or discharge electric charge depending on the magnitude of voltage applied through the gate electrode.

According to one embodiment of the present disclosure, the block oxide layer 140 may be disposed so as to surround the tunnel oxide layer 120 and the charge storage layer 130.

For example, the block oxide layer 140 may insulate the gate electrode 150 and the charge storage layer 130.

According to one embodiment of the present disclosure, the gate electrode 150 may be disposed on the block oxide layer 140 to surround the intrinsic region 114.

For example, the gate electrode 150 may apply first and second gate voltages to the diode structure 110 depending on the voltage difference.

For example, the first gate voltage may correspond to 18 V, the second gate voltage may correspond to −18 V, and a third gate voltage may correspond to 0 V.

For example, the first gate voltage may be referred to as a positive voltage, and the second gate voltage may be referred to as a negative voltage.

Figure 2:
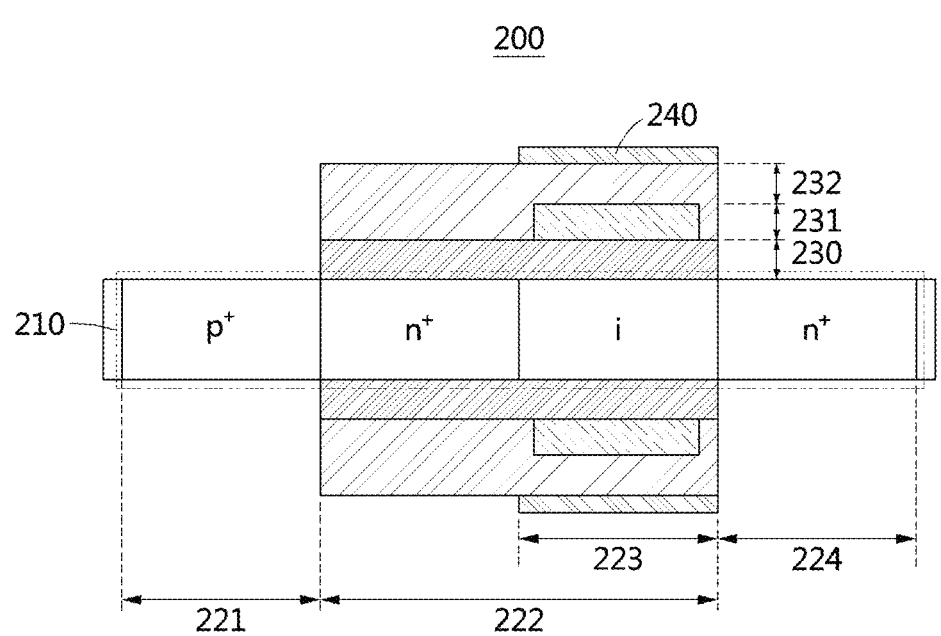
FIG. 2 is a drawing for explaining the sectional configuration of a feedback field-effect electronic device according to one embodiment of the present disclosure.

FIG. 2 is a drawing for explaining the sectional configuration of a feedback field-effect electronic device according to one embodiment of the present disclosure.

Referring to FIG. 2, the feedback field-effect electronic device 200 may include a diode structure 210, a tunnel oxide layer 230, a charge storage layer 231, a block oxide layer 232, and a gate electrode 240.

For example, the oxide layer 230, the charge storage layer 231, the block oxide layer 232, and the gate electrode 240 may be formed so as to surround the diode structure 210.

For example, in the diode structure 210, a second conductivity-type region 221 and an intrinsic region 223, which are located under the gate electrode 240, may be doped with a p-type impurity, and a first conductivity-type region 224 and the barrier region, which are not covered with the gate, may be doped with an n-type impurity.

The first and second conductivity-type regions 224 and 221 and the barrier region may have a doping concentration of $1\times10^{20}$ cm$^{-3}$, and the intrinsic region 223 may have a doping concentration of $1\times10^{15}$ cm$^{-3}$.

According to one embodiment of the present disclosure, the block oxide layer 232 may be thicker than the charge storage layer 231, and the tunnel oxide layer 230 may be thinner than the charge storage layer 231.

For example, the tunnel oxide layer 230 may have a thickness of about 6 nm, the charge storage layer 231 may have a thickness of about 7 nm, and the block oxide layer 232 may have a thickness of about 8 nm.

According to one embodiment of the present disclosure, the diode structure 210 may use the first conductivity-type region 224 as a source region, the second conductivity-type region 221 as a drain region, and the intrinsic region 223 and the barrier region as a channel region 222. In this case, the source region, the drain region, and the channel region may have identical lengths.

For example, when the overall length of the diode structure 210 is 160 nm, the first and second conductivity-type regions 224 and 221 and the channel region 222 may have identical lengths.

According to one embodiment of the present disclosure, when a first gate voltage is applied through the gate electrode 240, and a ground voltage is applied through the first and second conductivity-type regions 224 and 221, the charge storage layer 231 may receive electrons from the intrinsic region and may discharge holes to the intrinsic region.

For example, when a first gate voltage is applied through the gate electrode 240, and a ground voltage is applied through the first and second conductivity-type regions, the charge storage layer 231 may store electrons.

For example, when a second gate voltage is applied through the gate electrode 240, and a ground voltage is applied through the first and second conductivity-type regions, the charge storage layer 231 may discharge retained electrons to the channel region 222.

FIGS. 3A to 3D are graphs for explaining the write operation characteristics of a feedback field-effect electronic device according to one embodiment of the present disclosure.

Figure 3A:
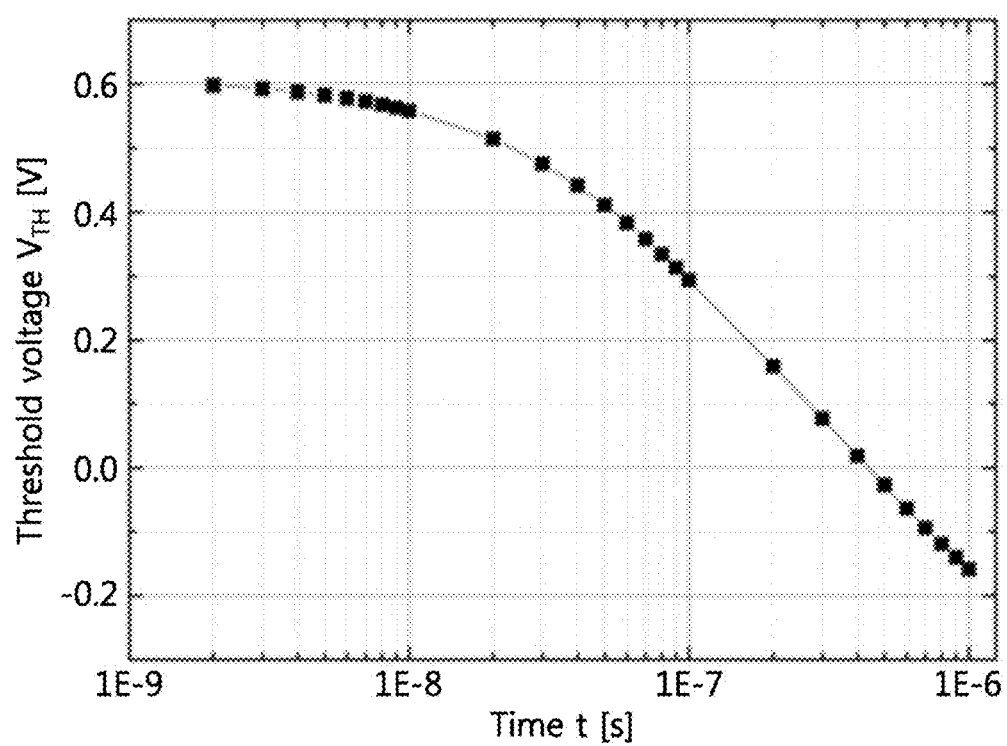
FIGS. 3A to 3D are graphs showing the non-volatile write operation characteristics of a feedback field-effect electronic device according to one embodiment of the present disclosure.
Figure 3B:
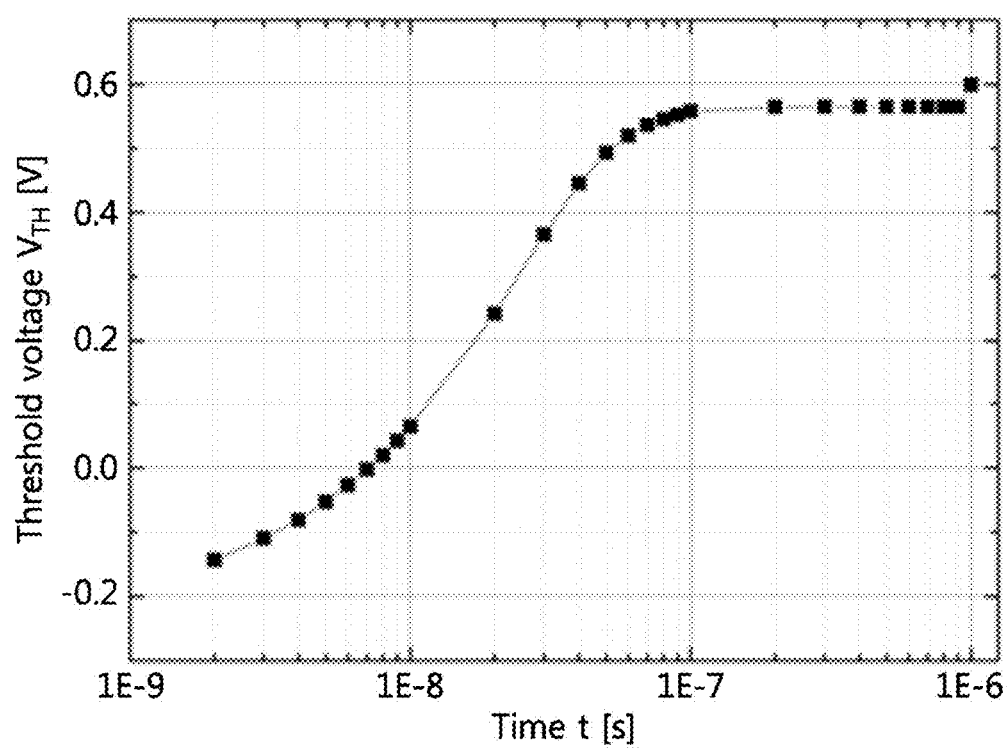

FIGS. 3A and 3B show changes in the threshold voltage ($V_{TH}$) of the feedback field-effect electronic device during performance of programming and deleting operations.

FIG. 3A shows changes in the threshold voltage of the feedback field-effect electronic device during performance of a programming operation of storing data in a first logic state.

Referring to the graph, a gate voltage applied for about 1 μs is +18 V, and source and drain voltages applied are 0 V. In this case, +18 V may be referred to as a positive voltage, and 0 V may be referred to as a ground voltage.

Therefore, in the feedback field-effect electronic device, electrons may be injected into the charge storage layer, and holes may be discharged from the charge storage layer by Fowler-Nordheim (FN) tunneling.

That is, when a positive voltage is applied through the gate electrode and a ground voltage is applied to drain and source regions, electrons present in the channel region may be introduced into the charge storage layer, so that the diode structure may perform a programming operation.

Referring to FIG. 3B, FIG. 3B shows changes in the threshold voltage of the feedback field-effect electronic device during performance of a programming operation of storing data in a second logic state.

Referring to the graph, a gate voltage applied for about 1 μs is −18 V, and source and drain voltages applied are 0 V. In this case, −18 V may be referred to as a negative voltage.

Therefore, in the feedback field-effect electronic device, electrons may be discharged from the charge storage layer, and holes may be injected into the charge storage layer by FN tunneling.

That is, when a negative voltage is applied through the gate electrode and a ground voltage is applied to drain and source regions, electrons present in the charge storage layer may be discharged into the channel region, so that the diode structure may perform an erasing operation.

Therefore, the diode structure may provide an effect similar to the operation in which a gate voltage applied is 0 V and drain and source voltages applied are 18 V.

Figure 3C:
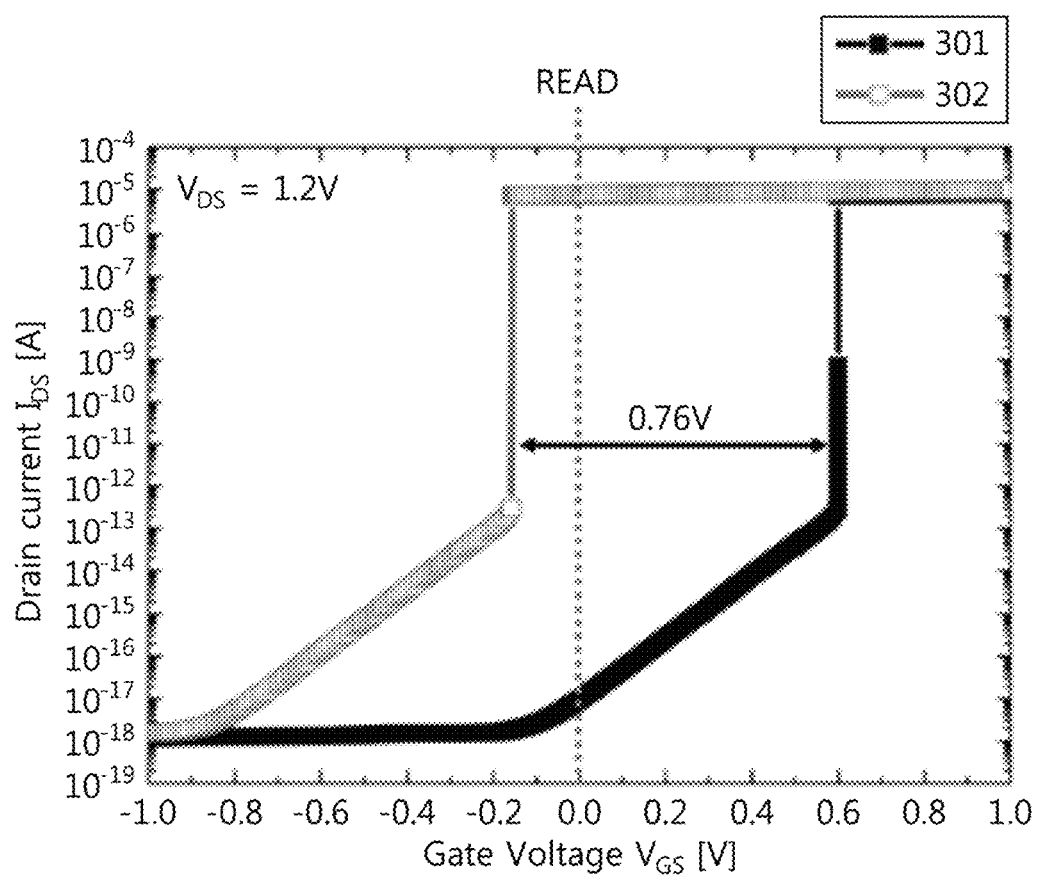

FIG. 3C shows the $I_{DS}$-$V_{GS}$ transfer curves of a device that stores data in first and second logic states at drain and source voltages of about 1.2 V.

Referring to the graph, the feedback field-effect electronic device according to one embodiment of the present disclosure exhibits steep switching characteristics and shows a threshold voltage ($V_{TH}$) window of 0.76 V.

In addition, the feedback field-effect electronic device may perform a programming operation 301 of storing data in a first logic state and an erasing operation 302 of storing data in a second logic state.

When data is stored in the feedback field-effect electronic device, an operation of storing data in a first logic state and an operation of storing data in a second logic state may be included.

For example, data in a first logic state may represent "1", and data in a second logic state may represent "0". In addition, in the above description, data in a first logic state corresponds to "1", and data in a second logic state corresponds to "0", but such association may be flexibly changed depending on memory setting.

In addition, operation of storing data in a first logic state in a feedback field-effect electronic device as a memory may be referred to as programming.

In addition, operation of storing data in a second logic state in a feedback field-effect electronic device as a memory may be referred to as erasing.

That is, the present disclosure may provide a feedback field-effect electronic device having properties such as bidirectional parallel operation, low power consumption, and high integration.

Figure 3D:
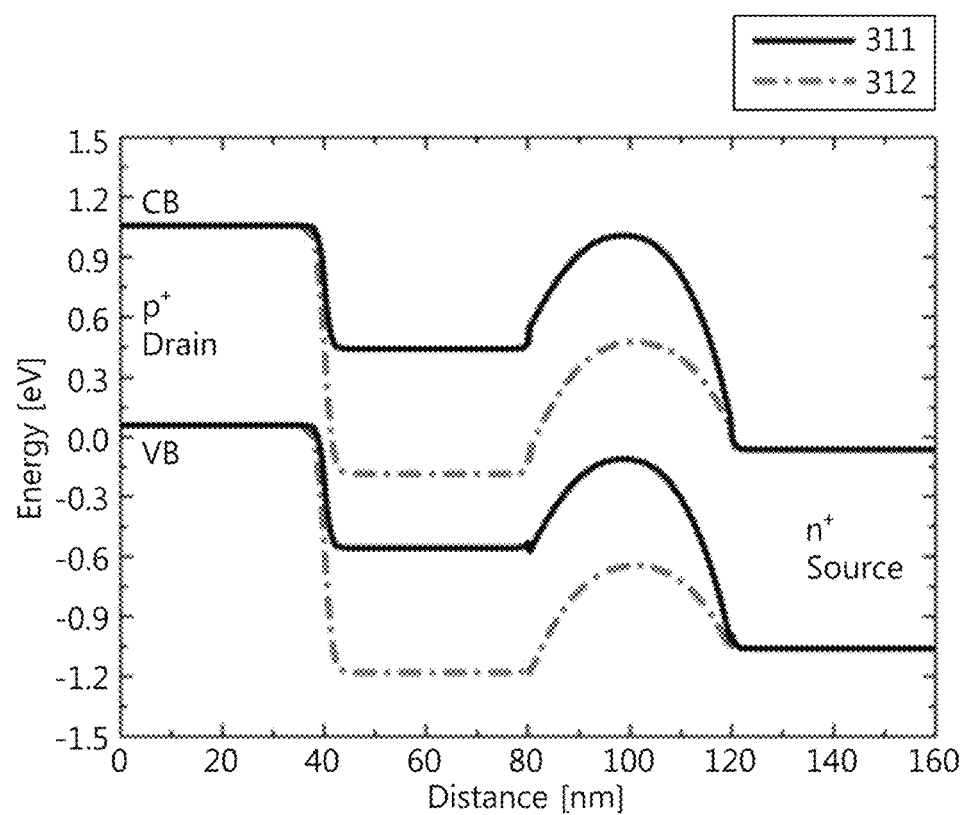

FIG. 3D shows an energy Venn diagram representing the state wherein data in a second logic state is stored after data in a first logic state is stored in a feedback field-effect electronic device according to one embodiment of the present disclosure.

In the graph, when observing the signal change of programming 311 for storing data in a first logic state and the signal change of erasing 312 for storing data in a second logic state, in the feedback field-effect electronic device in the programmed state, electrons trapped in the electric charge storage layer may increase an energy band and may create a barrier.

In addition, in the feedback field-effect electronic device in an erasing state in which data in a second logic state is stored, an energy barrier may not be formed due to the shortage of electrons in the electric charge storage layer.

Therefore, in the feedback field-effect electronic device in which data in a first logic state is stored, output current may not be generated when a read operation is performed by increasing a drain voltage. Therefore, the device in which data in a second logic state is stored may be turned on by a drain voltage without gate application.

FIGS. 4A to 4D are graphs for explaining the non-volatile read operation characteristics of a feedback field-effect electronic device according to one embodiment of the present disclosure.

Figure 4A:
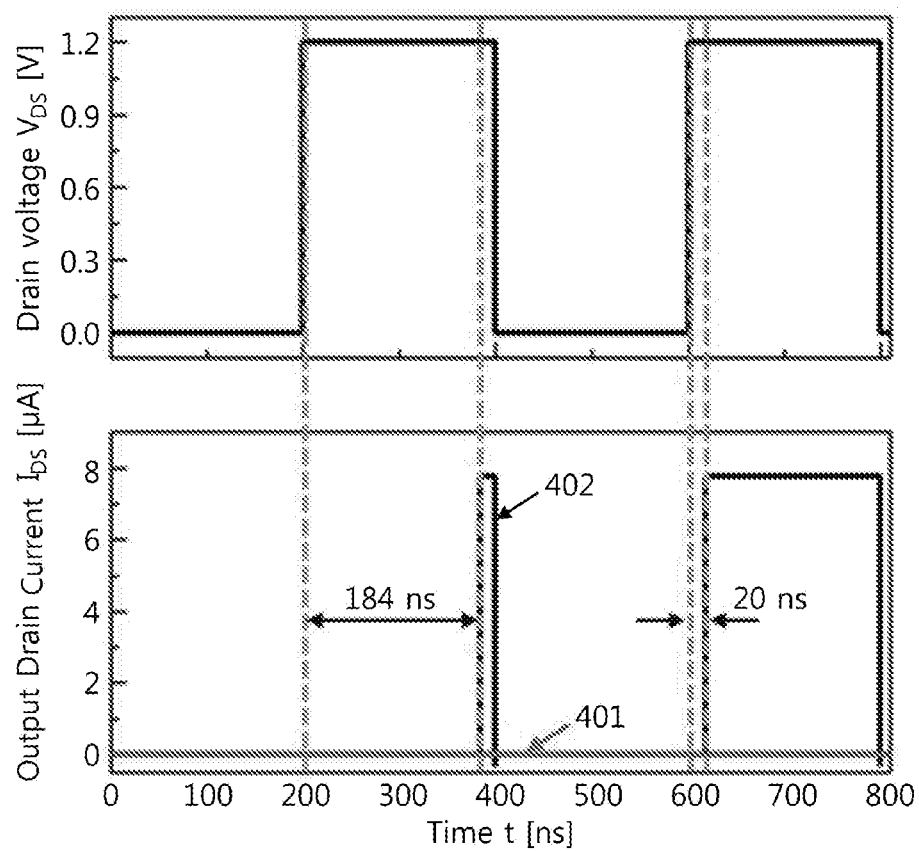
FIGS. 4A to 4D are graphs for explaining the non-volatile read operation characteristics of a feedback field-effect electronic device according to one embodiment of the present disclosure.

FIG. 4A shows the timing of two consecutive non-volatile read operations according to signals in a feedback field-effect electronic device according to one embodiment of the present disclosure.

More specifically, FIG. 4A shows the timing diagram of two consecutive non-volatile read operations. In this case, the first row may represent an input drain voltage, and the second row may represent output drain current.

The width of each voltage pulse may be 200 ns. The output drain current of a programmed device 402 may be 7.8 μA, and the output drain current of an erased device 401 may be 0.01 pA.

Referring to the graph, in the feedback field-effect electronic device according to one embodiment of the present disclosure, it takes about 184 ns to determine the state of the device at a first read pulse.

However, the feedback field-effect electronic device according to one embodiment of the present disclosure exhibits a delay of about 20 ns in the following read pulse, which may be less than the delay of the first pulse.

Figure 4B:
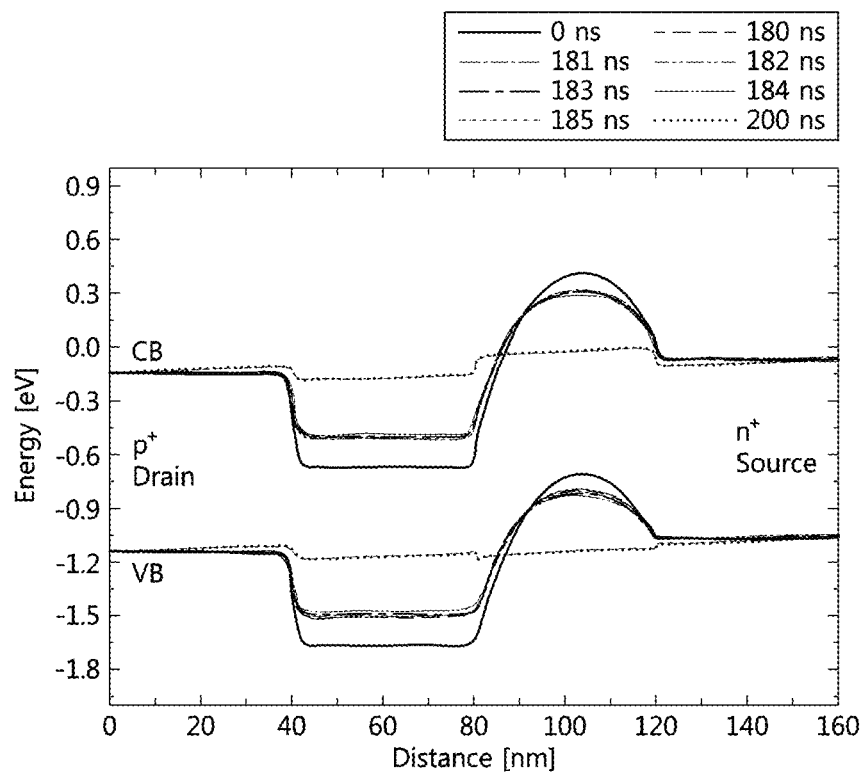
Figure 4C:
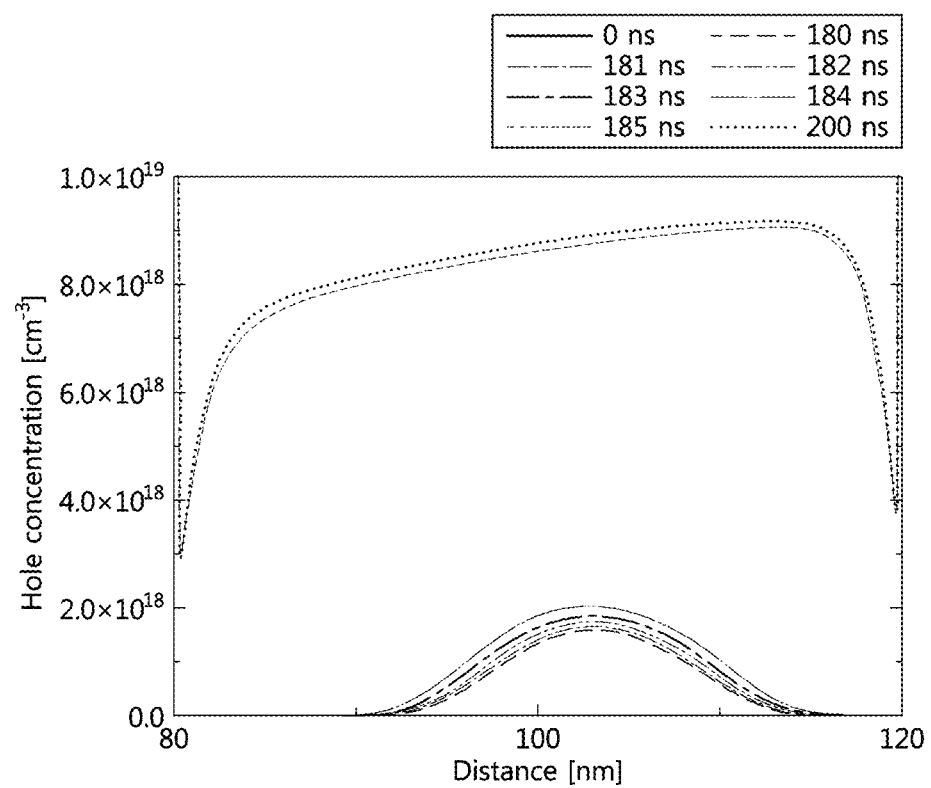

FIGS. 4B and 4C show the energy band diagram of each device and the hole concentration in the channel region along the distance from the center of the device during the first read pulse. In this case, the channel region may correspond to an intrinsic region.

Referring to FIG. 4B, an energy barrier abruptly collapses, and a hole pulse rapidly increases by 184 ns after a read pulse is applied.

Referring to FIG. 4C, during a read pulse, the hole concentration in the channel region along the distance from the center of the device is concentrated at a certain distance. In this case, the certain distance is about 100 nm.

Figure 4D:
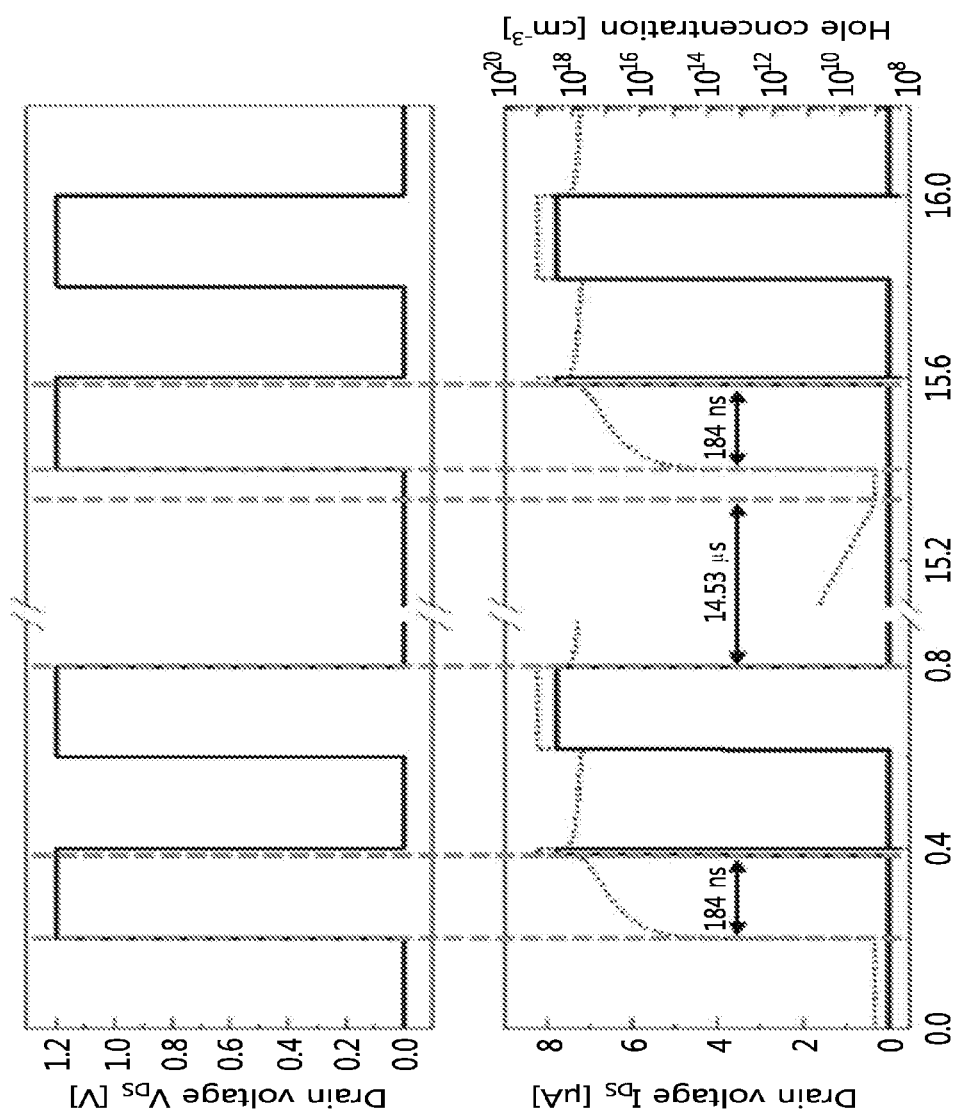

In FIG. 4D, the average hole concentration in the channel region and the output drain current to which a drain voltage is applied are shown. In the feedback field-effect electronic device according to one embodiment of the present disclosure, the initial hole concentration of the channel region after a drain voltage is applied is $1.13 \times 10^9$ cm$^{-3}$ and may be increased to $1.01 \times 10^{19}$ cm$^{-3}$.

As shown in FIG. 4D, the electric charge accumulated in the charge storage layer is not completely removed between the first and second read pulses.

For example, it may take about 14.53 μs to completely remove an electric charge accumulated in the charge storage layer and to reach the initial state. After the electric charge is completely removed, the read operation may exhibit the same delay of 184 ns.

That is, the present disclosure may implement a feedback field-effect electronic device that detects power consumption by requiring a low applied voltage in writing and erasing processes.

According to the present disclosure, holes accumulated in an intrinsic region potential may lower an electron barrier and a positive feedback mechanism may be triggered.

That is, a sufficient number of holes in the intrinsic region may be required to turn on the feedback field-effect electronic device.

Since a non-volatile read operation is performed by applying only drain voltage, only junction leakage current may be accumulated as charge in a potential well.

Accordingly, a delay in reading data may occur in the initial state.

In addition, consecutive read pulses may reduce the delay because accumulated electric charge is not completely removed after read pulses.

That is, the present disclosure may implement a feedback field-effect electronic device that allows miniaturization and integration of a memory device and that has low power consumption and high efficiency by reducing leakage current.

Figure 5:
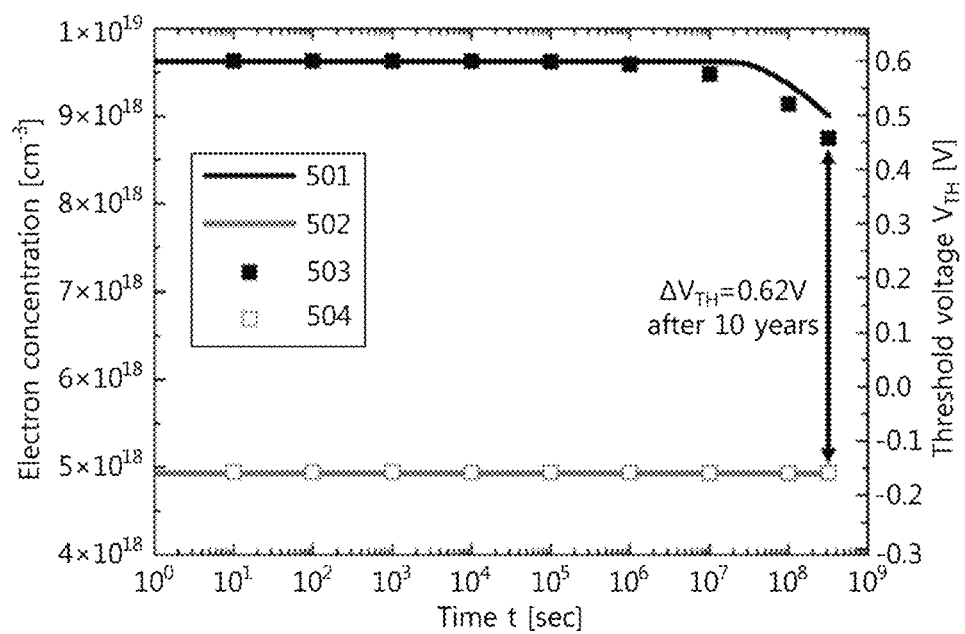
FIG. 5 is a graph for explaining the non-volatile data retention characteristics of a feedback field-effect electronic device according to one embodiment of the present disclosure.

FIG. 5 is a graph for explaining the non-volatile data retention characteristics of a feedback field-effect electronic device according to one embodiment of the present disclosure.

Referring to FIG. 5, in the graph, the horizontal axis represents change in time, and the vertical axis represents the concentration of electrons present in the charge storage layer.

In this case, a leader line 501 indicates the concentration of electrons trapped when the feedback field-effect electronic device performs a programming operation, and a leader line 502 indicates the concentration of electrons trapped when the feedback field-effect electronic device performs an erasing operation, a point 503 indicates a threshold voltage during a programming operation, and a point 504 indicates a threshold voltage during an erasing operation.

Time change proceeds without application of voltage at room temperature, and according to the time change, the difference between the points 503 and 504 may be about 0.62 V after about 10 years.

That is, the threshold voltage window of the feedback field-effect electronic device corresponding to the threshold voltage difference of the feedback field-effect electronic device according to one embodiment of the present disclosure may be large even after about 10 years.

Figure 6:
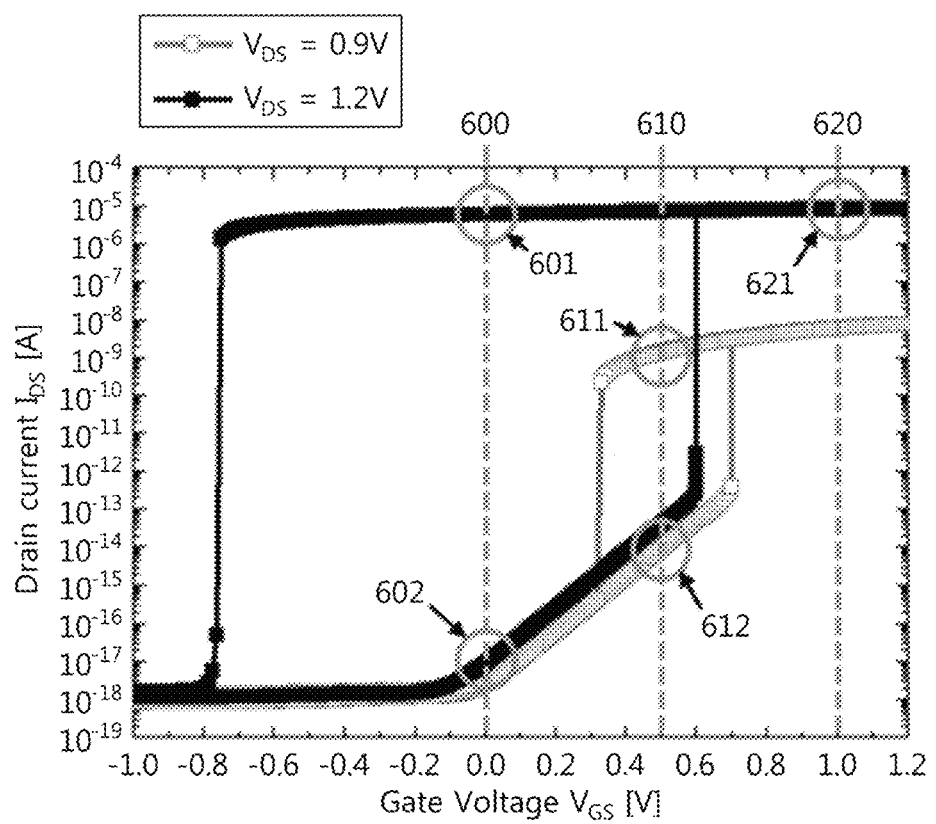
FIG. 6 is a graph for explaining the operation characteristics of a feedback field-effect electronic device according to one embodiment of the present disclosure as a volatile device.

FIG. 6 is a graph for explaining the operation characteristics of a feedback field-effect electronic device according to one embodiment of the present disclosure as a volatile device.

Referring to FIG. 6, in the graph, the horizontal axis represents change in a gate voltage, and the vertical axis represents change in drain current.

More specifically, in a recording operation 620, data in a first logic state 621 may be recorded in the feedback field-effect electronic device by increasing a drain voltage and a gate voltage to 1.2 V and 1.0 V, respectively.

In this case, the applied gate voltage may lower the electric charge barrier of the intrinsic region, so that electrons may begin to flow into the well of the barrier region.

In this case, a positive feedback loop may be generated, and the feedback field-effect electronic device according to one embodiment of the present disclosure may store the first logic state 621.

In addition, the feedback field-effect electronic device according to one embodiment of the present disclosure may remove accumulated electric charge from a channel by recording data in a second logic state by applying a gate voltage without a drain voltage, so that an energy barrier may be restored.

In a hold operation 610, a gate voltage may be applied at 0.5 V, and a drain voltage may be applied at 0.9 V. Once a feedback loop is generated by a write operation on data in a first logic state 611, power may be provided for a hold operation.

In addition, since the hold operation 610 is not sufficient to trigger a feedback loop, the device may retain a second logic state 612 by applying the same voltage.

A read operation 600 may be performed by applying 1.2 V and 0 V to the drain and the gate, respectively, of the feedback field-effect electronic device according to one embodiment of the present disclosure. In the read operation, an output drain current may be determined as first and second logic states 601 and 602 by sensing current associated with data recorded in the device.

For example, when a fourth gate voltage is applied through the gate electrode and a first drain voltage is applied through the second conductivity-type region, the feedback field-effect electronic device may store data in a first logic state.

In addition, when a fourth gate voltage is applied through a gate electrode and a second drain voltage is applied through the second conductivity-type region, the feedback field-effect electronic device may store data in a second logic state.

According to one embodiment of the present disclosure, when a fifth gate voltage is applied through the gate electrode and a third drain voltage is applied through the second conductivity-type region, the feedback field-effect electronic device may hold any one of data in a first logic state and data in a second logic state.

According to one embodiment of the present disclosure, when a sixth gate voltage is applied through the gate electrode and a first drain voltage is applied through the second conductivity-type region, the feedback field-effect electronic device may output current associated with retained data through the first conductivity-type region.

For example, the fourth gate voltage may be greater than the fifth gate voltage, and the sixth gate voltage may be less than the fifth gate voltage.

For example, the fourth gate voltage may correspond to a voltage of about 1 V, the fifth gate voltage may correspond to a voltage of about 0.5 V, and the sixth gate voltage may correspond to a voltage of about 0 V.

For example, the first drain voltage may be greater than the third drain voltage, and the second drain voltage may be less than the third drain voltage.

For example, the first drain voltage may correspond to about 1.2 V, the second drain voltage may correspond to about 0 V, and the third drain voltage may correspond to about 0.9 V.

Figure 7:
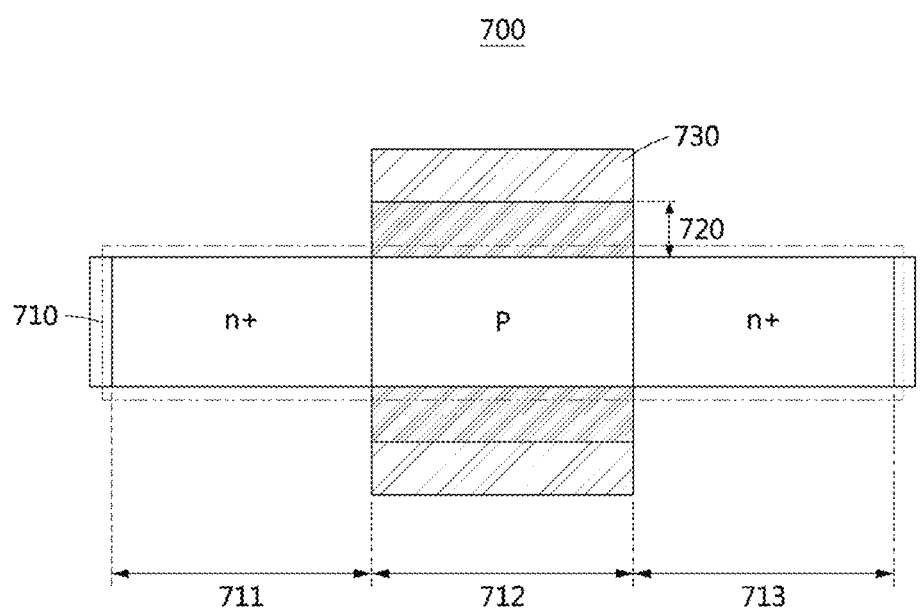
FIG. 7 is a cross-sectional view of an access electronic device according to one embodiment of the present disclosure.

FIG. 7 is a cross-sectional view of an access electronic device according to one embodiment of the present disclosure.

FIG. 7 is a cross-sectional view of the access electronic device connected to the diode structure described in FIG. 2.

Referring to FIG. 7, an access electronic device 700 may include an n-p-n nanostructure 710, a gate insulating film 720, and a gate electrode 730.

In the n-p-n nanostructure 710, a drain region 711 and a source region 713 may be n-doped, and a channel region 712 may be p-doped.

According to one embodiment of the present disclosure, the drain region 711 of the access electronic device 700 may be connected to the source region of the diode structure in series.

Figure 8:
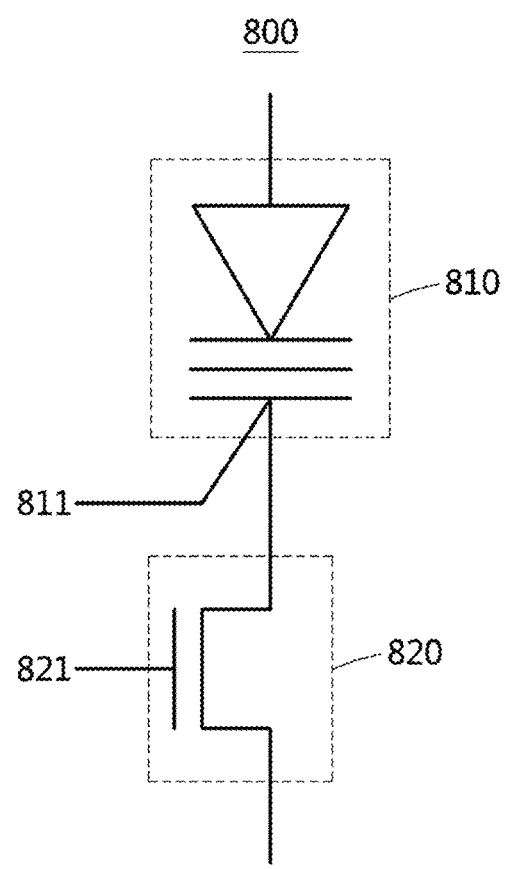
FIG. 8 is a circuit diagram of a feedback field-effect array device according to one embodiment of the present disclosure.

FIG. 8 is a circuit diagram of a feedback field-effect electronic device according to one embodiment of the present disclosure.

FIG. 8 shows a circuit diagram of a feedback field-effect electronic device including a diode structure and an access transistor connected to each other in series. In this case, the configuration of the diode structure is based on the description of FIGS. 1 and 2, and the configuration of the access transistor is based on the description of FIG. 7.

Referring to FIG. 8, a feedback field-effect electronic device 800 may include a diode structure 810 and an access electronic device 820.

The source region of the diode structure 810 may be connected to the drain region of the access transistor in series, the drain region of the diode structure may be connected to a bit line, and the gate electrode may be connected to a first word line 811.

In addition, the gate electrode of an access transistor 820 may be connected to a second word line 821.

According to one embodiment of the present disclosure, the feedback field-effect electronic device 800 may operate as a cell for recording non-volatile data.

Hereinafter, a programming operation of storing data in a first logic state and an erasing operation of storing data in a second logic state in the feedback field-effect electronic device 800 will be described.

First, in the programming operation, when a voltage of about 5 V to 9 V is applied to the second word line 821 while a bit-line voltage is in a floating state and a ground voltage is applied to the source region of the access electronic device, the feedback field-effect electronic device 800 may have a body potential of 0 V.

For example, when a programming voltage is applied to the first word line 811 in a state wherein a body potential is 0 V, the feedback field-effect electronic device 800 may perform programming by storing electric charge in the charge storage layer.

In this case, the programming voltage may correspond to about 18 V, and the programming operation may be referred to as an operation of storing data in a first logic state.

In addition, in the case of another feedback field-effect electronic device sharing the first word line 811 with the feedback field-effect electronic device 800, a body potential rises to a threshold voltage and is self-boosted.

In this case, when a programming voltage is applied to the first word line 811, the potential of the gate insulating film is not secured based on the body potential, which is raised to the threshold voltage, so that electric charge may not be introduced into the charge storage layer and programming may not be performed.

That is, when the voltage of the bit line is floated, a first gate voltage is applied through the first word line, the half voltage of the first gate voltage is applied through the second word line, data in a first logic state may be stored in the charge storage layer included in the feedback field-effect electronic device 800.

In this case, the first gate voltage may correspond to 18 V.

Next, in the erasing operation, when a bit-line voltage is applied at 18 V, a voltage of 0 V is applied to the second word line 821, and a ground voltage is applied to the source region of the access electronic device, the feedback field-effect electronic device 800 may have a body potential of 18 V.

In this case, when a voltage of 0 V is applied to the first word line 811, electric charge may be discharged from the charge storage layer and data in a second logic state may be recorded.

For example, this may be similar to the operation in which the body potential is 0 V and a voltage of −18 V is applied to the first word line 811.

That is, when voltage corresponding to a first gate voltage is applied through the bit line and a ground voltage is applied to the first and second word lines, data in a second logic state may be stored in the charge storage layer included in the feedback field-effect electronic device 800.

In addition, the body potential of another feedback field-effect electronic device sharing the bit line with the feedback field-effect electronic device 800 rises to 18 V. However, since a voltage is not applied through the first word line and electric charge is not discharged from the charge storage layer, erasing may not be performed.

For example, when a voltage is applied to the bit line and the second word line 821, the feedback field-effect electronic device 800 may perform a read operation based on output detection by outputting current.

In addition, in the feedback field-effect electronic device 800, when a voltage is not applied to the second word line 821, the access electronic device 820 may not operate, and thus current may not be output.

According to the above description, the feedback field-effect electronic device according to one embodiment of the present disclosure may perform conversion between volatile and non-volatile operations, and may perform volatile and non-volatile operations.

That is, when an array circuit is designed using the feedback field-effect electronic device, conversion between volatile and non-volatile operations may be possible, and volatile and non-volatile operations may be performed.

Figure 9:
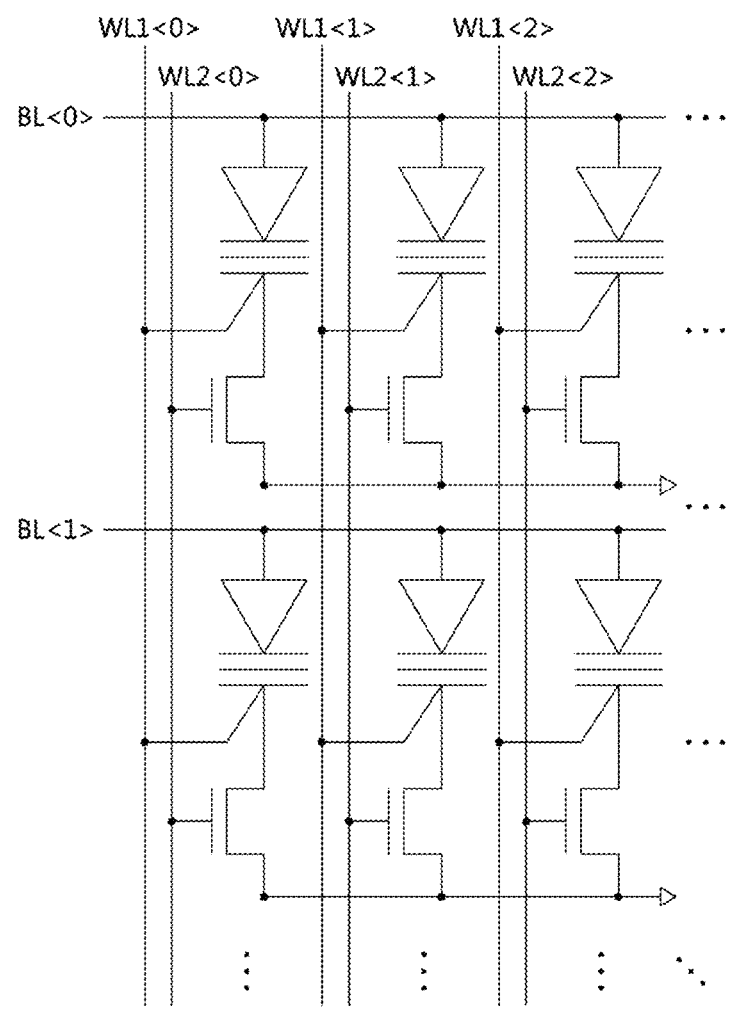
FIG. 9 is a drawing for explaining an array circuit using a feedback field-effect array device according to one embodiment of the present disclosure.

FIG. 9 is a drawing for explaining an array circuit using a feedback field-effect electronic device according to one embodiment of the present disclosure.

FIG. 9 shows an array circuit in which a plurality of feedback field-effect electronic devices are arranged in 3×3.

Referring to FIG. 9, the feedback field-effect electronic devices may be arranged in the row direction and in the column direction, the row direction of the array circuit may share a bit line, and the column direction shares a first word line.

The operation of the array circuit using a plurality of feedback field-effect electronic devices depends on the operation of the feedback field-effect electronic device described in FIG. 8.

Figure 10A:
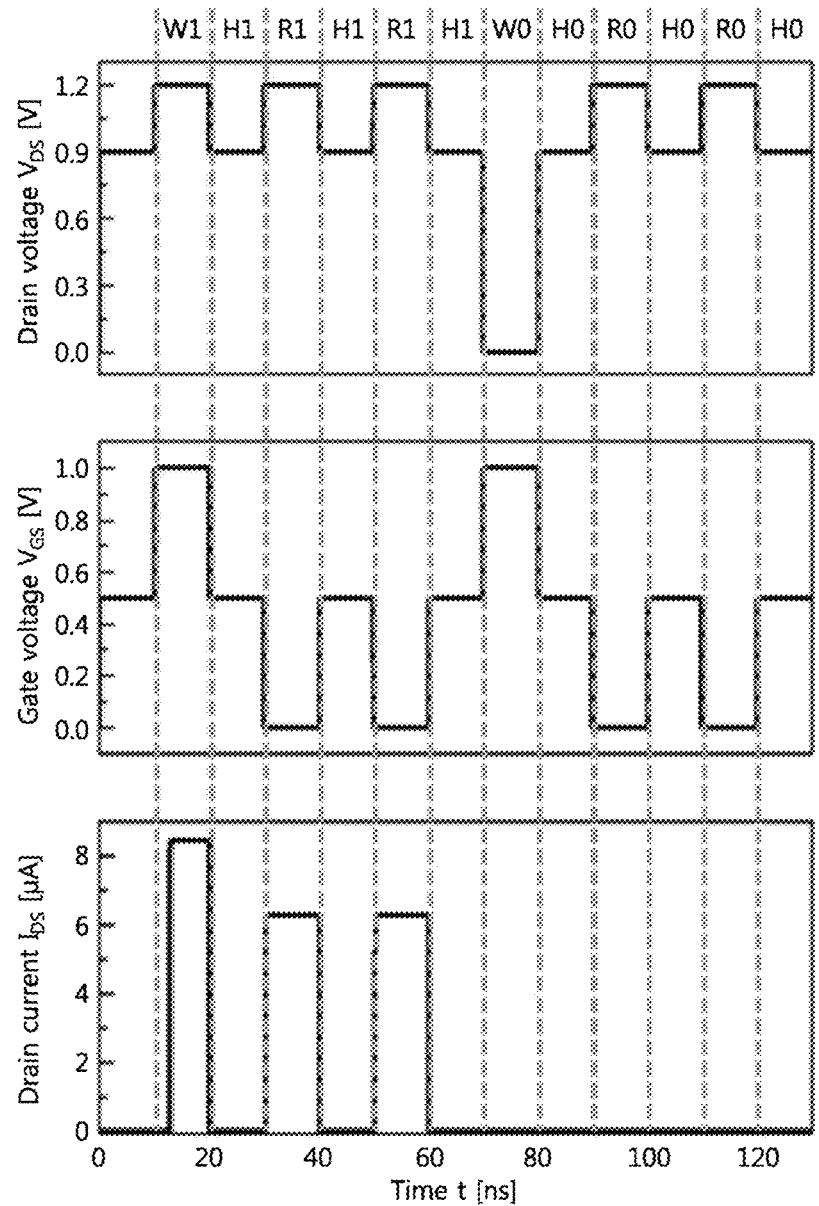
FIGS. 10A and 10B are graphs for explaining the volatile operation characteristics of an array circuit according to one embodiment of the present disclosure.
Figure 10B:
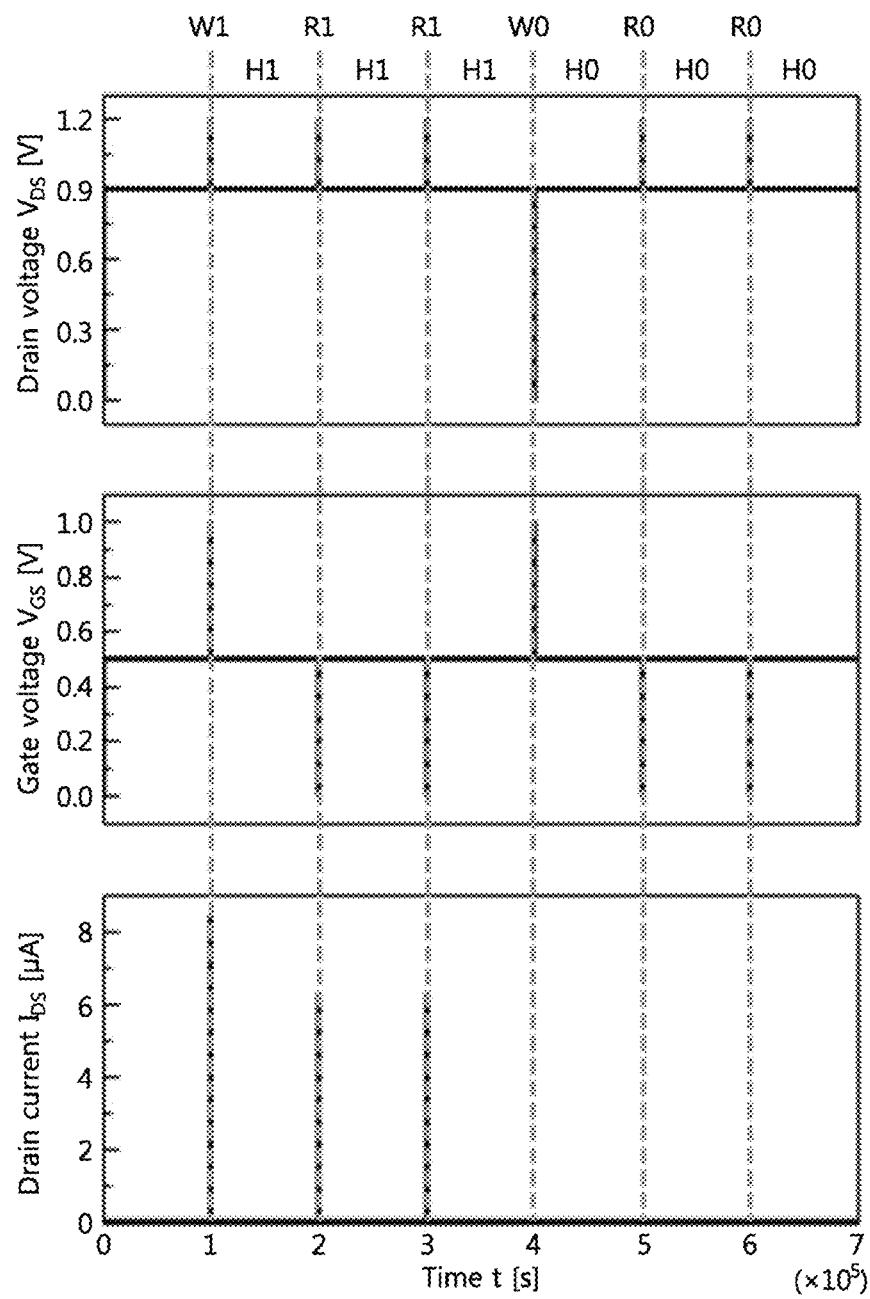

FIGS. 10a and 10b are graphs for explaining the operation characteristics a diode structure according to one embodiment of the present disclosure as a volatile device.

FIG. 10a includes the timing diagrams of a volatile memory operation.

In FIG. 10a, the first row represents a drain voltage pulse, the second row represents a gate voltage pulse, and the third row represents output drain current.

The width of each voltage pulse is 10 ns, and a programming operation of storing data in a first logic state exhibits a delay of 3 ns and an output current of 8.4 µA.

The output currents of the read operations for data in a first logic state and data in a second logic state may be correspond to 6.3 µA and 20 pA, respectively.

According to one embodiment of the present disclosure, the diode structure requires low holding current. That is, the diode structure may consume 1.5 nA to hold data in a first logic state.

In addition, the diode structure may consume about 2.0 pA to hold data in a second logic state.

The diode structure according to one embodiment of the present disclosure may have nondestructive reading characteristics in consecutive read operations unlike a conventional DRAM.

That is, in the diode structure, the transition between read and hold operations does not affect the positive feedback mechanism, so the device may hold the state thereof.

FIG. 10b shows the timing diagrams when a diode structure according to one embodiment of the present disclosure performs a hold operation for $10^5$ seconds, and shows the holding characteristics of the device in a volatile memory operation.

Referring to the graph, the diode structure according to one embodiment of the present disclosure performs a hold operation for $10^5$ seconds between write and read operations.

The diode structure according to one embodiment of the present disclosure has a pulse width of 10 ns in both write and read operations.

Referring to the graph, the diode structure according to one embodiment of the present disclosure holds data for at least $10^5$ seconds.

Therefore, according to the present disclosure, due to the positive feedback mechanism, the stored value may be theoretically held without a refreshing operation.

The present disclosure can implement an array circuit using a feedback field-effect electronic device capable of implementing both volatile and non-volatile operation characteristics in a single device.

The present disclosure can implement an array circuit using a feedback field-effect electronic device that allows miniaturization and integration of a memory device and that has low power consumption and high efficiency by reducing leakage current.

The present disclosure can implement an array circuit using a feedback field-effect electronic device capable of detecting current and performing a read operation in a relatively short time.

The present disclosure can prevent a short channel effect caused by miniaturization, wherein the short channel effect may occur when the feedback field-effect electronic device having a high sensing margin detects current in a relatively short time and performs a rapid write operation.

The present disclosure can implement can implement an array circuit using a feedback field-effect electronic device that requires a low applied voltage during writing and erasing processes, thereby reducing power consumption.

The claims of the present disclosure or the methods according to embodiments described in this specification may be implemented in hardware, software, or a combination of hardware and software.

Such software may be stored on a computer-readable storage medium. The computer-readable storage medium stores at least one program (software module) including instructions for causing an electronic device to perform the method of the present disclosure when executed by at least one processor in the electronic device.

Such software may be stored in the form of a volatile storage device or a non-volatile storage device such as read only memory (ROM), in the form of memory such as random access memory (RAM), memory chips, and device or integrated circuits, or in an optical or magnetic readable medium, such as compact disc-ROMs (CD-ROMs), digital versatile discs (DVDs), magnetic disks, and magnetic tapes.

The storage device and medium are machine-readable storage means suitable for storing programs including instructions for implementing embodiments when executed.

In the above-described specific embodiments, elements included in the disclosure are expressed in singular or plural in accordance with the specific embodiments.

However, the singular or plural expression are appropriately selected for the situation presented for convenience of explanation, and the above-described embodiments are not limited to the singular or plural constituent elements. In addition, elements may be composed of the singular number, even when the elements are expressed in the plural number, and an element may be composed of the plural number, even when the element is expressed in the singular number.

The aforementioned description is provided only to illustrate embodiments according to the present disclosure. Those skilled in the art will appreciate that various modifications, additions and substitutions are possible, without departing from the scope and spirit of the disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

DESCRIPTION OF SYMBOLS

110: DIODE STRUCTURE
112: FIRST CONDUCTIVITY-TYPE REGION
114: INTRINSIC REGION
116: BARRIER REGION
118: SECOND CONDUCTIVITY-TYPE REGION
120: TUNNEL OXIDE LAYER
130: CHARGE STORAGE LAYER
140: BLOCK OXIDE LAYER
150: GATE ELECTRODE

What is claimed is:

1. An array circuit, comprising:
a plurality of feedback field-effect electronic devices, wherein a source region of the feedback field-effect electronic device and a drain region of an access electronic device are connected to each other in series;
the feedback field-effect electronic device is directly connected to a bit line and a first word line;
the access electronic device is connected to a source line and a second word line; and
any one of first and second gate voltages is applied to the first word line to store data in a first logic state or data in a second logic state.

2. The array circuit according to claim 1, wherein the feedback field-effect electronic device comprises a diode structure comprising first and second conductivity-type regions, an intrinsic region disposed between the first and second conductivity-type regions, and a barrier region disposed between the intrinsic region and the second conductivity-type region;
a tunnel oxide layer disposed so as to surround the barrier region and the intrinsic region;
a charge storage layer disposed on the tunnel oxide layer and responsible for storing electric charge of current introduced from the diode structure;
a block oxide layer disposed so as to surround the tunnel oxide layer and the charge storage layer; and
a gate electrode disposed so as to surround the intrinsic region on the block oxide layer.

3. The array circuit according to claim 2, wherein, when the first gate voltage is applied through the gate electrode, and a ground voltage is applied through the first and second conductivity-type regions, the charge storage layer traps electrons introduced from the intrinsic region.

4. The array circuit according to claim 3, wherein, when the second gate voltage is applied through the gate electrode, and the ground voltage is applied through the first and second conductivity-type regions, the charge storage layer discharges the trapped electrons into the intrinsic region.

5. The array circuit according to claim 4, wherein, when the ground voltage is applied through the first conductivity-type region and the gate electrode, and a first drain voltage is applied through the second conductivity-type region, the feedback field-effect array electronic device outputs current associated with the trapped electrons or the discharged electrons through the first conductivity-type region.

6. The array circuit according to claim 5, wherein the first gate voltage is greater than the ground voltage, and the second gate voltage is less than the ground voltage.

7. The array circuit according to claim 2, wherein, when a voltage of the bit line is floated, the first gate voltage is applied through the first word line, and a half voltage of the first gate voltage is applied through the second word line, the data in the first logic state is stored in the charge storage layer.

8. The array circuit according to claim 7, wherein, when a voltage corresponding to the first gate voltage is applied through the bit line, and a ground voltage is applied through the first and second word lines, the charge storage layer stores the data in a second logic state.

9. The array circuit according to claim 3, wherein the charge storage layer is formed using silicon nitride;
the tunnel oxide layer is formed using silicon dioxide; and
the block oxide layer is formed using aluminum oxide.

10. The array circuit according to claim 2, wherein, in the diode structure, the first conductivity-type region is used as a source region, the second conductivity-type region is used as a drain region, and the intrinsic region and the barrier region are used as a channel region, wherein the first source region, the drain region, and the channel region have identical lengths.

11. The array circuit according to claim 10, wherein, in the diode structure, the first conductivity-type region and the barrier region are doped with an n-type impurity, and the second conductivity-type region is doped with a p-type impurity.

12. The array circuit according to claim 2, wherein, in the diode structure, the intrinsic region and the barrier region operate as a channel region through which electric charge moves, and
the first and second conductivity-type regions and the channel region are formed to have identical lengths.

13. The array circuit according to claim 2, wherein the block oxide layer is thicker than the charge storage layer, and the tunnel oxide layer is thinner than the charge storage layer.

14. The array circuit according to claim 2, wherein, when a fourth gate voltage is applied through the gate electrode, and a first drain voltage is applied through the second conductivity-type region, the feedback field-effect electronic device stores data in the first logic state.

15. The array circuit according to claim 14, wherein, when the fourth gate voltage is applied through the gate electrode, and a second drain voltage is applied through the second conductivity-type region, the feedback field-effect electronic device stores data in the second logic state.

16. The array circuit according to claim 15, wherein, when a fifth gate voltage is applied through the gate electrode, and a third drain voltage is applied through the second conductivity-type region, the feedback field-effect electronic device holds any one of the data in the first logic state and the data in the second logic state.

17. The array circuit according to claim 16, wherein, when a sixth gate voltage is applied through the gate electrode, and the first drain voltage is applied through the second conductivity-type region, the feedback field-effect electronic device outputs current associated with the held data through the first conductivity-type region.

* * * * *